(12) United States Patent
Zhang

(10) Patent No.: US 11,094,389 B2
(45) Date of Patent: Aug. 17, 2021

(54) SHIFT REGISTER UNIT AND DRIVING METHOD, GATE DRIVING CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventor: Yang Zhang, Beijing (CN)

(73) Assignees: HEFEI XINSHENG OPTOELECTRONICS TECHNOLOG CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 89 days.

(21) Appl. No.: 16/400,368

(22) Filed: May 1, 2019

(65) Prior Publication Data

US 2020/0098441 A1    Mar. 26, 2020

(30) Foreign Application Priority Data

Sep. 26, 2018    (CN) .......................... 201811124330.6

(51) Int. Cl.
*G11C 19/00*    (2006.01)
*G11C 19/28*    (2006.01)
(Continued)

(52) U.S. Cl.
CPC ............. *G11C 19/287* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS 7,436,923 B2    10/2008 Tobita
7,450,681 B2    11/2008 Wei et al.
(Continued)

FOREIGN PATENT DOCUMENTS

CN    101261881 A    9/2008
CN    102867543 A    9/2012
(Continued)

OTHER PUBLICATIONS

The First Chinese Office Action dated Jun. 29, 2020; Appln. No. 201811124330.6.
(Continued)

*Primary Examiner* — Tuan T Lam

(57) ABSTRACT

A shift register unit, a gate driving circuit, a display device and a driving method are disclosed. The shift register unit includes an input circuit, a first node reset circuit, an output circuit and a first reset control circuit. The input circuit is configured to provide an input signal to a first node; the first node reset circuit is configured to reset the first node under control of a level of a reset control node; the output circuit is configured to output an output signal at the output terminal under control of a level of the first node; and the first reset control circuit is configured to control the level of the reset control node in response to a reset control signal.

12 Claims, 8 Drawing Sheets

(51) Int. Cl.
 *G09G 3/20* (2006.01)
 *G09G 3/36* (2006.01)
(52) U.S. Cl.
 CPC ............... *G09G 2300/0426* (2013.01); *G09G 2310/0286* (2013.01); *G09G 2310/08* (2013.01)

(56) References Cited

U.S. PATENT DOCUMENTS

| | | | | |
|---|---|---|---|---|
| 2006/0290390 | A1* | 12/2006 | Jang | G11C 19/28 327/112 |
| 2007/0188436 | A1* | 8/2007 | Wei | G11C 19/00 345/100 |
| 2007/0188672 | A1 | 8/2007 | Sato et al. | |
| 2008/0101529 | A1* | 5/2008 | Tobita | G11C 19/28 377/64 |
| 2008/0219401 | A1* | 9/2008 | Tobita | G11C 19/28 377/79 |
| 2015/0302935 | A1* | 10/2015 | Zeng | G11C 19/28 377/64 |
| 2016/0012911 | A1* | 1/2016 | Han | G09G 3/2096 377/64 |
| 2016/0086562 | A1 | 3/2016 | Tan et al. | |
| 2017/0270851 | A1 | 9/2017 | Shang et al. | |
| 2018/0122321 | A1 | 5/2018 | Qian | |
| 2018/0190232 | A1* | 7/2018 | Xue | G09G 3/3677 |
| 2019/0206294 | A1* | 7/2019 | Tian | G09G 3/20 |
| 2019/0287446 | A1* | 9/2019 | Liao | G09G 3/20 |

FOREIGN PATENT DOCUMENTS

| | | | |
|---|---|---|---|
| CN | 103714792 | A | 12/2013 |
| CN | 105185349 | A | 11/2015 |
| CN | 105741741 | A | 4/2016 |
| CN | 106448596 | A | 10/2016 |
| CN | 108206001 | A | 1/2018 |
| KR | WO2014/193102 | * | 5/2014 |
| TW | 200731209 | A | 8/2007 |
| WO | 2012/008186 | A1 | 1/2012 |
| WO | 2014/193102 | A1 | 12/2014 |

OTHER PUBLICATIONS

The Second Chinese Office Action dated Dec. 24, 2020; Appln. No. 201811124330.6.

* cited by examiner

SHIFT REGISTER UNIT AND DRIVING METHOD, GATE DRIVING CIRCUIT, AND DISPLAY DEVICE

CROSS-REFERENCE TO RELATED APPLICATION

The application claims priority to Chinese patent application No. 201811124330.6, filed on Sep. 26, 2018, the entire disclosure of which is incorporated herein by reference as part of the present application.

TECHNICAL FIELD

Embodiments of the present disclosure relate to a shift register unit, a driving method, a gate driving circuit, and a display device.

BACKGROUND

In the field of display technology, pixel arrays of such as liquid crystal display panels generally include a plurality of rows of gate lines and a plurality of columns of data lines interleaved therewith. The gate lines can be driven by a bonding integrated driving circuit. In recent years, with the continuous improvement of the preparation technology of amorphous silicon thin film transistors or oxide thin film transistors, the gate line driving circuit can also be directly integrated on the thin film transistor array substrate to form a GOA (Gate driver On Array) to drive the gate lines. For example, the GOA composed of a plurality of cascaded shift register units may be used to provide state switching voltage signals (scanning signals) to the plurality of rows of gate lines of the pixel array, so as to control the plurality of rows of gate lines to be sequentially turned on, for example, and the data lines simultaneously provide data signals to the pixel units of corresponding rows in the pixel array to form gray scale voltages required for each gray scale of a display image at each pixel unit, thereby displaying a frame of image. Nowadays, more and more display panels use GOA technology to drive gate lines. GOA technology helps to realize the narrow frame design of the display panel and can reduce the production cost of the display panel.

SUMMARY

At least one embodiment of the present disclosure provides a shift register unit, including an input circuit, a first node reset circuit, an output circuit, and a first reset control circuit. The input circuit is connected to a first node and is configured to provide an input signal to the first node; the first node reset circuit is connected with the first node and a reset control node, and is configured to reset the first node under control of a level of the reset control node; the output circuit is connected with the first node and an output terminal, and is configured to output an output signal at the output terminal under control of a level of the first node; and the first reset control circuit is connected to the reset control node and is configured to control the level of the reset control node in response to a reset control signal.

For example, in the shift register unit provided by an embodiment of the present disclosure, the first reset control circuit includes a first control sub-circuit. The first control sub-circuit is connected to the reset control node and is configured to control the level of the reset control node in response to a clock signal, and the reset control signal includes the clock signal; and the output circuit outputs the clock signal as the output signal at the output terminal under control of the level of the first node.

For example, in the shift register unit provided by an embodiment of the present disclosure, the first reset control circuit further includes a second control sub-circuit. The second control sub-circuit is connected to the reset control node and is configured to control the level of the reset control node in response to the input signal, and the reset control signal further includes the input signal.

For example, in the shift register unit provided by an embodiment of the present disclosure, the first control sub-circuit includes an inverting circuit that is configured to apply an inverting signal that is inverted from the clock signal to the reset control node for controlling the level of the reset control node.

For example, in the shift register unit provided by an embodiment of the present disclosure, the inverting circuit includes a first transistor and a second transistor. A gate electrode of the first transistor and a first electrode of the first transistor are electrically connected, and are configured to be respectively connected to a first voltage terminal to receive a first voltage, and a second electrode of the first transistor is connected to the reset control node; and a gate electrode of the second transistor is connected to a clock signal terminal to receive the clock signal, a first electrode of the second transistor is connected to the reset control node, and a second electrode of the second transistor is connected to a second voltage terminal to receive a second voltage.

For example, in the shift register unit provided by an embodiment of the present disclosure, the second control sub-circuit includes a third transistor. A gate electrode of the thud transistor is connected to an input terminal to receive the input signal, a first electrode of the third transistor is connected to the reset control node, and a second electrode of the third transistor is connected to a second voltage terminal to receive a second voltage.

For example, the shift register unit provided by an embodiment of the present disclosure further includes a second reset control circuit. The second reset control circuit is connected to the reset control node and is configured to control the level of the reset control node in response to a reset signal.

For example, the shift register unit provided by an embodiment of the present disclosure further includes an output reset circuit. The output reset circuit is connected with the reset control node and the output terminal, and is configured to reset the output terminal under control of the level of the reset control node.

For example, the shift register unit provided by an embodiment of the present disclosure further includes a second node control circuit, a first node noise reduction circuit, and an output noise reduction circuit. The second node control circuit is connected with the first node and a second node, and is configured to control a level of the second node under control of the level of the first node; the first node noise reduction circuit is connected with the first node and the second node, and is configured to reduce noise at the first node under control of the level of the second node; and the output noise reduction circuit is connected with the second node and the output terminal, and is configured to reduce noise at the output terminal under control of the level of the second node.

At least one embodiment of the present disclosure further provides a gate driving circuit, including a plurality of cascaded shift register units provided by any one of the embodiments of the present disclosure.

For example, the gate driving circuit provided by an embodiment of the present disclosure further includes clock signal lines. The clock signal lines are connected with clock signal terminals of the plurality of cascaded shift register units to provide clock signals, and the reset control signal includes the clock signal.

At least one embodiment of the present disclosure further provides a display device, including the gate driving circuit provided by any one of the embodiments of the present disclosure.

At least one embodiment of the present disclosure further provides a method of driving the shift register unit provided by any one of the embodiments of the present disclosure, including: during a period other than in a case where the input circuit provides the input signal to the first node and the output circuit outputs the output signal under control of the level of the first node, allowing the first reset control circuit to receive the reset control signal to control the level of the reset control node, so that the first node reset circuit resets the first node under control of the level of the reset control node.

For example, the method of driving the shift register unit provided by an embodiment of the present disclosure further includes: allowing the input circuit to control the level of the first node in response to the input signal, and allowing the output circuit to output the output signal under control of the level of the first node.

For example, in the method of driving the shift register unit provided by an embodiment of the present disclosure, the shift register unit further includes a second reset control circuit, and the driving method further includes: allowing the second reset control circuit to control the level of the reset control node in response to a reset signal so that the first node reset circuit resets the first node under control of the level of the reset control node.

BRIEF DESCRIPTION OF THE DRAWINGS

In order to clearly illustrate the technical solution of the embodiments of the present disclosure, the drawings of the embodiments will be briefly described in the following, it is obvious that the described drawings in the following are only related to some embodiments of the present disclosure, and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure will be described below by several specific embodiments. In order to keep the following description of embodiments of the present disclosure clear and concise, detailed descriptions of known functions and known components may be omitted. When any component of embodiments of the present disclosure appears in more than one of the drawings, the component is denoted by the same or similar reference symbol in each drawing.

Figure 1:
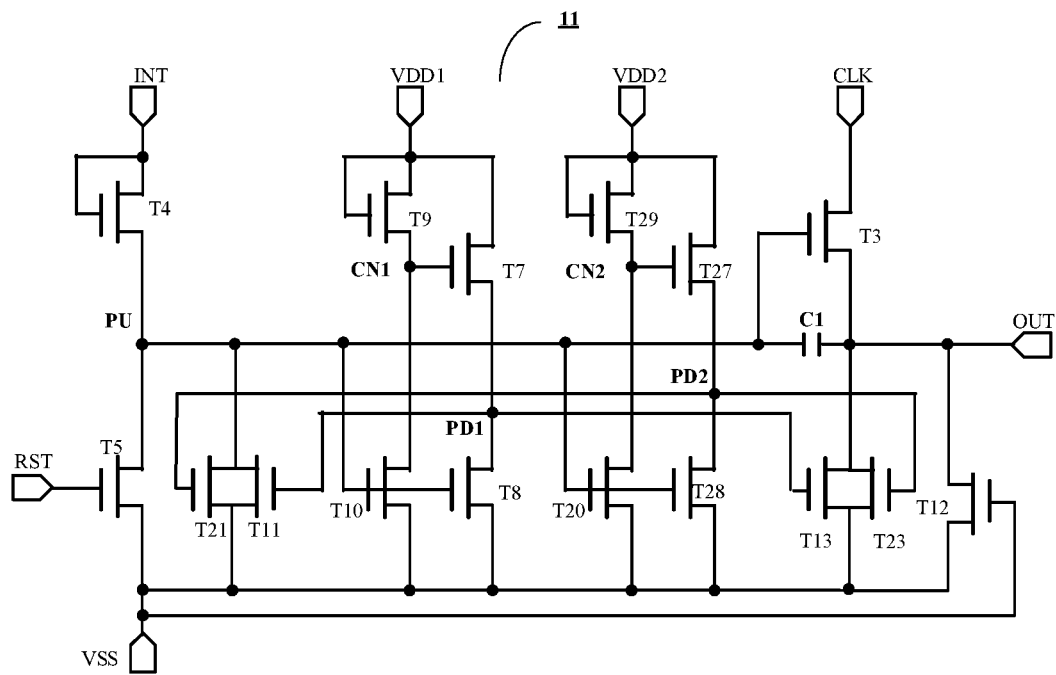
FIG. 1 is a schematic diagram of a circuit structure of a shift register unit.

FIG. 1 is a schematic diagram of a circuit structure of a shift register unit. A gate driving circuit may be formed by cascading a plurality of such shift register units for driving, for example, a liquid crystal display panel or an organic light-emitting diode display panel. As shown in FIG. 1, the shift register unit 11 includes a reset terminal RST, and for example, the reset terminal RST is connected to an output terminal OUT of the next shift register unit cascaded therewith or an output terminal OUT of a shift register unit of a lower stage that is separated therefrom by at least one stage. For example, a reset signal provided by the reset terminal RST is an output signal of the next shift register unit cascaded with the reset terminal RST, so that after the current shift register unit outputs an output signal, a pull-up node PU of the current shift register unit and an output terminal OUT of the current shift register unit are reset through the output signal of the next shift register unit, so as to prevent the current shift register unit from generating erroneous output in a non-output phase.

However, some transistors in the shift register unit are prone to drift under the influence of factors such as ambient temperature or voltage stress, thereby resulting in no output or abnormal output of the shift register unit. In a case where the next shift register unit cascaded with the shift register unit of the present stage does not output or has abnormal output, the reset terminal RST of the shift register unit of the present stage cannot be reset because the reset terminal RST of the shift register unit of the present stage cannot receive the output signal (i.e., the reset signal of the shift register unit of the present stage) of the next shift register unit, thus causing the shift register unit of the present stage to output abnormally in the non-output phase, generating a multi-output phenomenon, and affecting the display quality of the display panel.

At least one embodiment of the present disclosure provides a shift register unit, including an input circuit, a first node reset circuit, an output circuit, and a first reset control circuit. The input circuit is connected to a first node and is configured to provide an input signal to the first node; the first node reset circuit is connected with the first node and a reset control node, and is configured to reset the first node under the control of a level of the reset control node; the output circuit is connected with the first node and an output terminal, and is configured to output an output signal at the output terminal under the control of a level of the first node; and the first reset control circuit is connected to the reset control node and is configured to control the level of the reset control node in response to a reset control signal. The embodiments of the present disclosure also provide a gate driving circuit, a display device and a driving method which are corresponding to the shift register unit described above.

According to the shift register unit provided by the embodiments of the present disclosure, normal reset of the circuit can be ensured in a case where the reset signal is abnormal, and multi-output phenomenon caused by abnormal reset signal is avoided, so that the stability of the circuit structure of the shift register unit and the display quality of the display panel are improved.

Embodiments of the present disclosure and examples thereof will be described in detail below with reference to the accompanying drawings.

Figure 2:
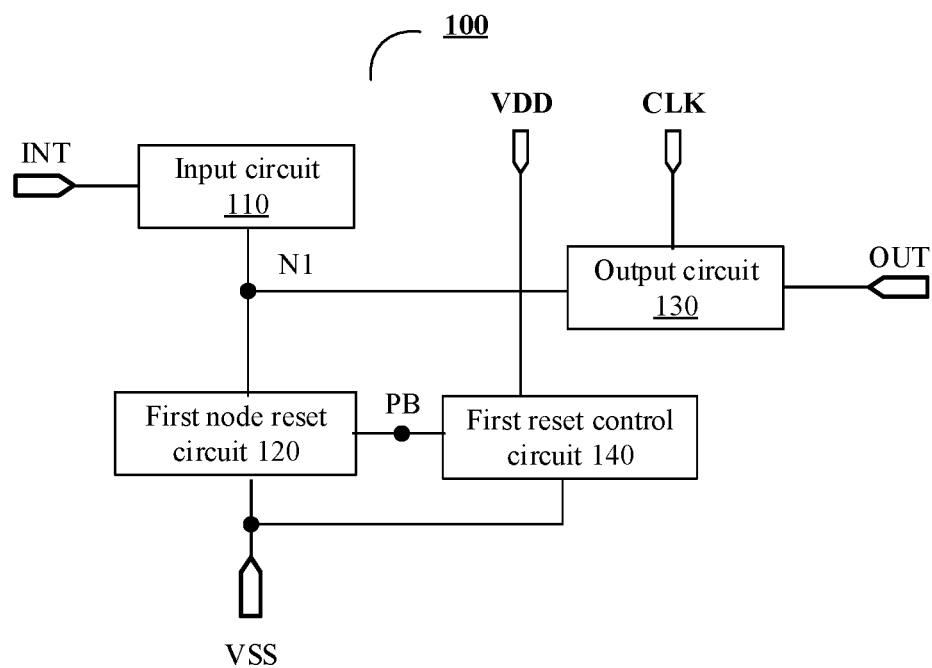
FIG. 2 is a schematic diagram of a shift register unit provided by at least one embodiment of the present disclosure.

FIG. 2 is a schematic diagram of a shift register unit provided by at least one embodiment of the present disclosure. As shown in FIG. 2, the shift register unit 100 includes an input circuit 110, a first node reset circuit 120, an output circuit 130, and a first reset control circuit 140. A gate driving circuit can be obtained by cascading a plurality of shift register units 100, and the gate driving circuit is used for driving a display panel such as a liquid crystal display panel or an organic light-emitting diode display panel and is used for sequentially providing scanning signals for a plurality of gate lines of the display panel, thereby performing progressive scanning, interlaced scanning or the like during the display of one frame in the display panel.

As shown in FIG. 2, the input circuit 110 is connected to a first node N1 (e.g., a pull-up node here), and is configured to charge the first node N1 in response to an input signal. For example, in some examples, the input circuit 110 is connected to an input terminal INT and the first node N1, and is configured to be turned on under the control of the input signal provided by the input terminal INT, so that the input terminal INT or a separately provided voltage terminal (e.g., a high voltage terminal) is connected to the first node N1, and the input signal provided by the input terminal INT or a high level signal provided by the separately provided voltage terminal is input to the first node N1 to charge (e.g. pull up) a level of the first node N1 to an operating level (i.e., an effective level).

The first node reset circuit 120 is connected to the first node N1 and a reset control node PB, and is configured to reset the first node N1 under the control of a level of the reset control node PB. For example, the first node reset circuit 120 may be connected to the first node N1, a second voltage terminal VSS (e.g., providing a low voltage) or another voltage terminal (e.g., a low voltage terminal), and the reset control node PB, so that the first node N1 can be electrically connected to the second voltage terminal VSS or another voltage terminal under the control of the level of the reset control node. PB to perform a pull-down reset on the first node N1.

The output circuit 130 is connected to the first node N1 and an output terminal OUT, and is configured to output an output signal at the output terminal OUT under the control of the level of the first node N1. For example, in some examples, the output circuit 130 is connected to a clock signal terminal CLK, the first node N1, and the output terminal OUT, and is configured to be turned on under the control of the level of the first node N1 to transmit a clock signal provided by the clock signal terminal CLK to the output terminal OUT, and output the clock signal as the output signal at the output terminal OUT. Alternatively, in another example, the output circuit 130 is also connected to a voltage terminal (e.g., a high voltage terminal) provided separately, and the clock signal provided by the clock signal terminal CLK is used as a control signal to control whether the voltage terminal is connected to the output terminal OUT, thereby controlling whether a voltage signal of the voltage terminal is transmitted to the output terminal OUT and is output as the output signal at the output terminal OUT.

The first reset control circuit 140 is connected to the reset control node PB and is configured to control the level of the reset control node PB in response to a reset control signal. For example, the first reset control circuit 140 may be connected to a first voltage terminal VDD (e.g., providing a high voltage) or a separately provided voltage terminal (e.g., a high voltage terminal), the second voltage terminal VSS (e.g., providing a low voltage) or a separately provided voltage terminal (e.g., a low voltage terminal), a reset control terminal (not shown) and the reset control node PB, so that the level of the reset control node PB may be controlled in response to the reset control signal provided by the reset control terminal. For example, in one example, the reset control terminal may include the clock signal terminal and therefore, in this example, the reset control signal may include the clock signal so that the first reset control circuit 140 may control the level of the reset control node PB response to the clock signal. In another example, the reset control terminal may further include the input terminal INT, so that the reset control signal may further include the input signal, and thus, in this example, the first reset control circuit 140 may further control the level of the reset control node PB in response to the input signal. The two different examples described above are shown in FIG. 3 and FIG. 4 respectively, which will be described in detail in the following and will not be repeated here.

The first reset control circuit 140 controls the level of the reset control node PB in response to the reset control signal, and may control the level of the reset control node PB to a level that is inverted from a level of the clock signal provided by the clock signal terminal CLK during a period of time other than in a case where the input circuit 110 provides the input signal to the first node N1 and the output circuit 130 outputs the output signal under the control of the level of the first node N1, so that the first node reset circuit 120 resets the first node N1 under the control of the level of the reset control node PB. The reset operation on the first node N1 thus performed is not related to the reset signal, but is only related to the reset control signal, so that normal reset of the circuit can be ensured in a case where the reset signal is abnormal, and multi-output phenomenon caused by abnormal reset signal is avoided, thereby improving the stability of the circuit structure of the shift register unit and improving the display quality of the display panel.

According to the shift register unit provided by the embodiments of the present disclosure described above, normal reset of the circuit can be ensured in a case where the reset signal is abnormal, and multi-output phenomenon caused by abnormal reset signal is avoided, so that the stability of the circuit structure of the shift register unit and the display quality of the display panel are improved.

Figure 3:
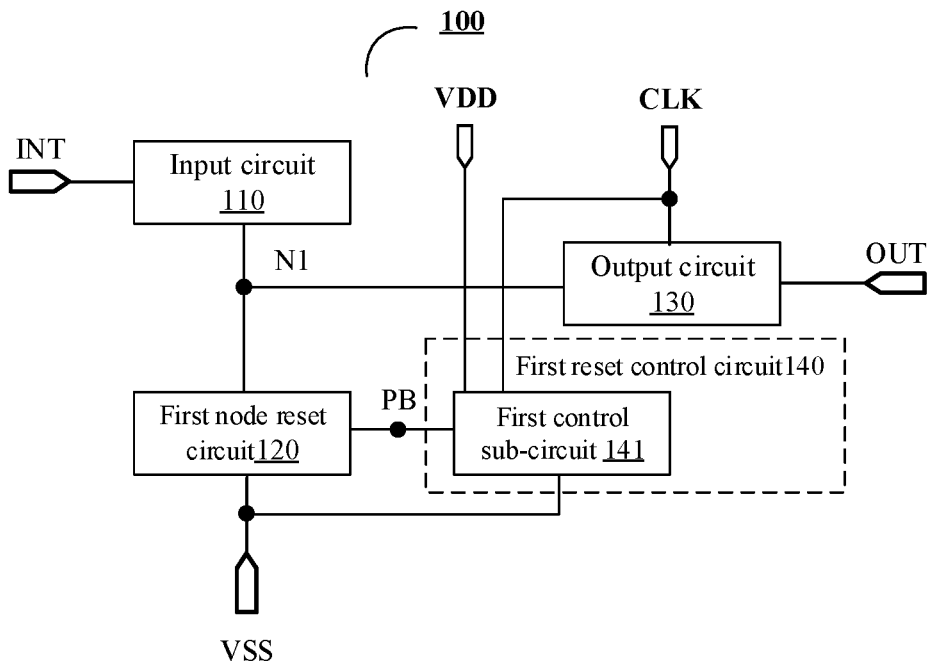
FIG. 3 is a schematic diagram of another shift register unit provided by at least one embodiment of the present disclosure.

FIG. 3 is a schematic diagram of another shift register unit provided by at least one embodiment of the present disclosure. As shown in FIG. 3, the first reset control circuit 140 of the shift register unit 100 includes a first control sub-circuit 141. It should be noted that other circuit structures of the shift register unit 100 shown in FIG. 3 are basically the same as those of the shift register unit 100 shown in FIG. 2, and will not be repeated here.

As shown in FIG. 3, the first control sub-circuit 141 is connected to the reset control node PB and is configured to control the level of the reset control node PB in response to the clock signal. For example, in this example, the reset control signal includes the clock signal, and the first control sub-circuit 141 is connected to the clock signal terminal CLK, the first voltage terminal VDD (e.g., providing a high voltage) or another voltage terminal (e.g., a high voltage terminal), the second voltage terminal VSS (e.g., providing a low voltage) or another voltage terminal (e.g., a low voltage terminal), and the reset control node PB, so that the level of the reset control node PB can be controlled in response to the clock signal provided by the clock signal terminal CLK. For example, by controlling the level of the reset control node PB by controlling a change of the clock signal, the level of the reset control node PB can be controlled to be inverted from the level of the clock signal provided by the clock signal terminal CLK for a period of time other than in a case where the input circuit 110 provides the input signal to the first node N1 and the output circuit 130 outputs the output signal under the control of the level of the first node N1, so that the first node reset circuit 120 resets the first node N1 under the control of the level of the reset control node PB. The reset operation on the first node N1 thus performed is not related to the reset signal, but is only related to the reset control signal, so that the normal reset of the circuit can be ensured in a case where the reset signal is abnormal, and the phenomenon of multiple outputs caused by the abnormality of the reset signal is avoided, thereby improving the stability of the circuit structure of the shift register unit and improving the display quality of the display panel.

For example, the first control sub-circuit 141 includes an inverting circuit (not shown), and is configured to apply an inverting signal that is inverted from the clock signal to the reset control node PB for controlling the level of the reset control node PB. For example, the level of the reset control node PB is inverted from the level of the clock signal. When the clock signal is at an invalid level, that is, in a non-output phase of the output terminal OUT, the level of the reset control node PB is controlled to be an effective level, so that under the control of the level of the reset control node PB, the first node reset circuit 120 is controlled to be turned on to reset the first node N1, thereby avoiding erroneous output due to abnormality of the reset signal in the non-output phase. It should be noted that the following embodiments are the same and will not be described again.

For example, the output circuit 130 outputs the clock signal as the output signal at the output terminal OUT under the control of the level of the first node N1. Therefore, in this example, the output of the shift register unit and the reset of the shift register unit can be realized by adjusting the clock signal.

For example, in this example, in a phase of pre-charging the first node N1, the input signal is at a high level and the clock signal is at a low level, so that the reset control node PB is connected to the first voltage terminal VDD. Thus the reset control node PB is at a high level, and the input circuit 110 and the first node reset circuit 120 are simultaneously turned on under the control of the level of the input signal and the level of the reset control node PB. For example, in this phase, the parameters (e.g., the width-length ratio of channels) of the transistors of the input circuit 110 and the transistors of the first node reset circuit 120 can be implemented by design so that the first node N1 is still charged in a case where the input circuit 110 and the first node reset circuit 120 are simultaneously turned on. The specific implementation process will be described in detail in the following and will not be repeated here.

Figure 4:
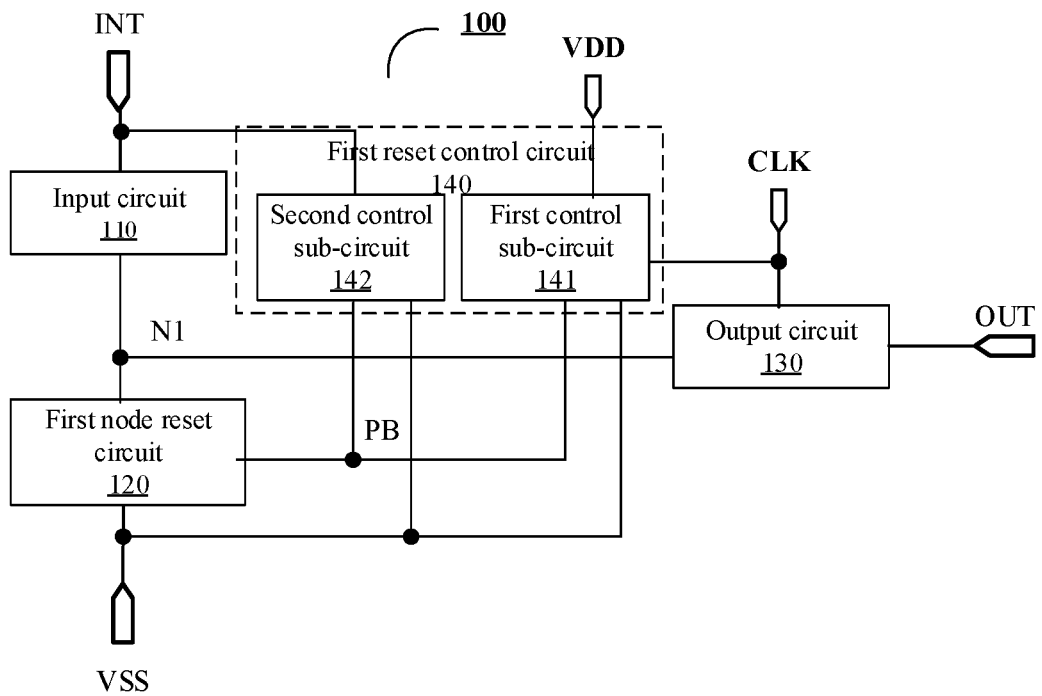
FIG. 4 is a schematic diagram of further still another shift register unit provided by at least one embodiment of the present disclosure.

FIG. 4 is a schematic diagram of further still another shift register unit provided by an embodiment of the present disclosure. As shown in FIG. 4, the first reset control circuit 140 of the shift register unit 100 further includes a second control sub-circuit 142. It should be noted that other circuit structures of the shift register unit 100 shown in FIG. 4 are basically the same as those of the shift register unit 100 shown in FIG. 3, and will not be repeated here.

As shown in FIG. 4, the second control sub-circuit 142 is connected to the reset control node PB and is configured to control the level of the reset control node PB in response to the input signal. For example, in this example, the reset control signal further includes the input signal, and the second control sub-circuit 142 is connected to the second voltage terminal VSS (e.g., providing a low voltage) or another voltage terminal (e.g., a low voltage terminal), the input terminal INT, and the reset control node PB, so that the level of the reset control node PB can be controlled in response to the reset control signal. For example, the second control sub-circuit 142 may control the level of the reset control node PB to a second voltage (e.g., at a low level) under the control of the input signal in a case where the input circuit 110 provides the input signal to the first node N1 (i.e., when the first node N1 is charged), so as to prevent the first node reset circuit 120 from being timed on under the control of the reset control node PB, which leads to resetting the first node N1 during the phase of pre-charging the first node N1, thereby preventing the first node N1 from being normally charged and affecting the normal output of the output terminal OUT.

The first control sub-circuit 141 that is included in the first reset control circuit 140 in this embodiment may further control the level of the reset control node PB to a level that is inverted from the level of the clock signal provided by the clock signal terminal CLK in response to the clock signal that is included in the reset control signal in a period of time other than in a case where the input circuit 110 provides the input signal to the first node N1 and the output circuit 130 outputs the output signal under the control of the level of the first node N1, so that the first node reset circuit 120 resets the first node N1 under the control of the level of the reset control node PB. The reset operation on the first node N1 thus performed is not related to the reset signal, but is only related to the reset control signal, so that normal reset of the circuit can be ensured in a case where the reset signal is abnormal, and multi-output phenomenon caused by abnormal reset signal is avoided, thereby improving the stability of the circuit structure of the shift register unit and improving the display quality of the display panel.

The input circuit and the output circuit (and the first node N1) which are included in the shift register units shown in FIG. 2 to FIG. 4 may be implemented in various forms, such as a basic structure of 4T1C, and in different implementations, these shift register units may further include other functional modules such as a noise reduction module, a leakage prevention module, etc., for example, with reference to the following description. However, embodiments of the present disclosure are not limited to these specific forms.

Figure 5A:
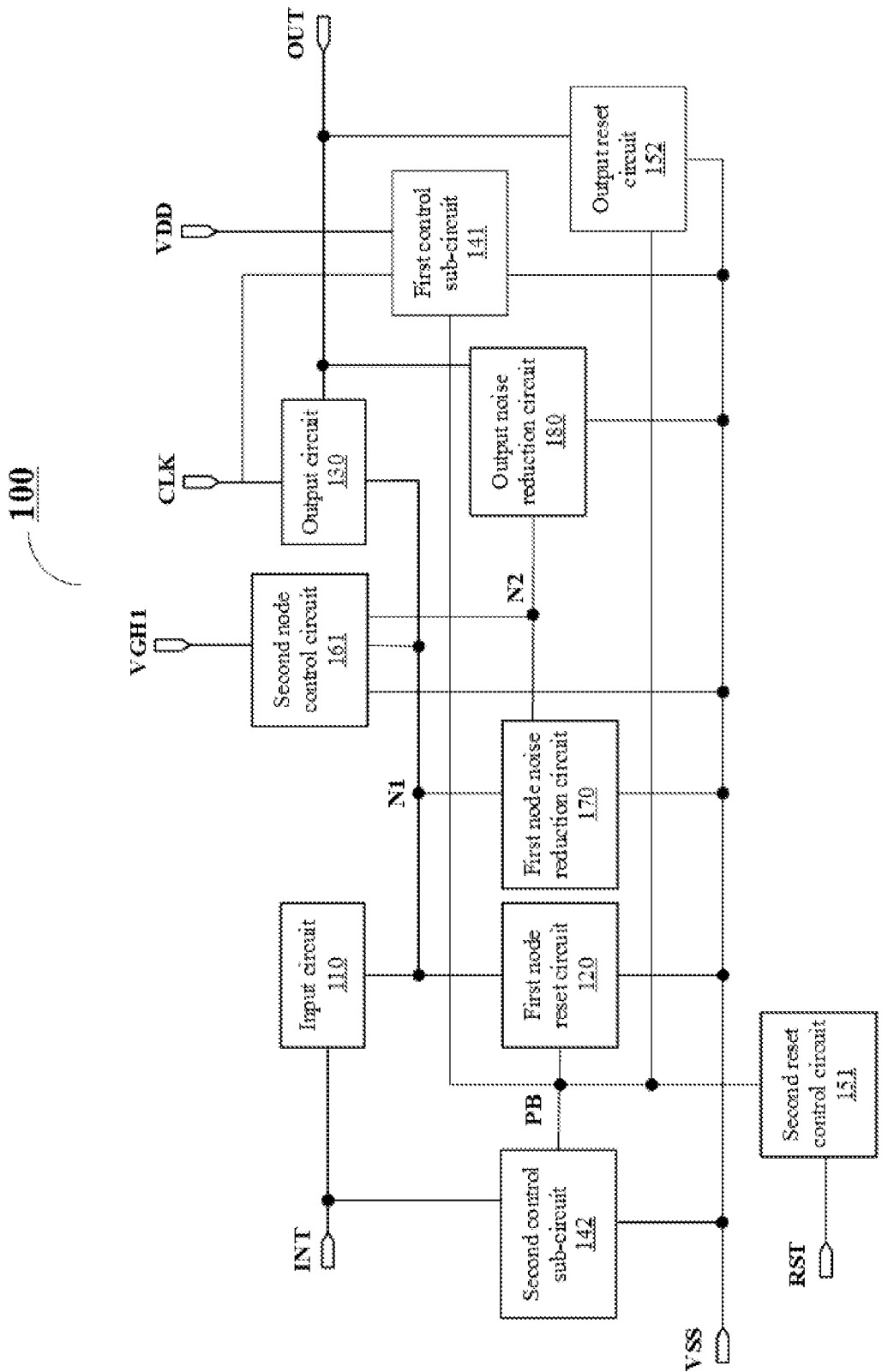
FIG. 5A is a schematic diagram of further still another shift register unit provided by at least one embodiment of the present disclosure.
Figure 5B:
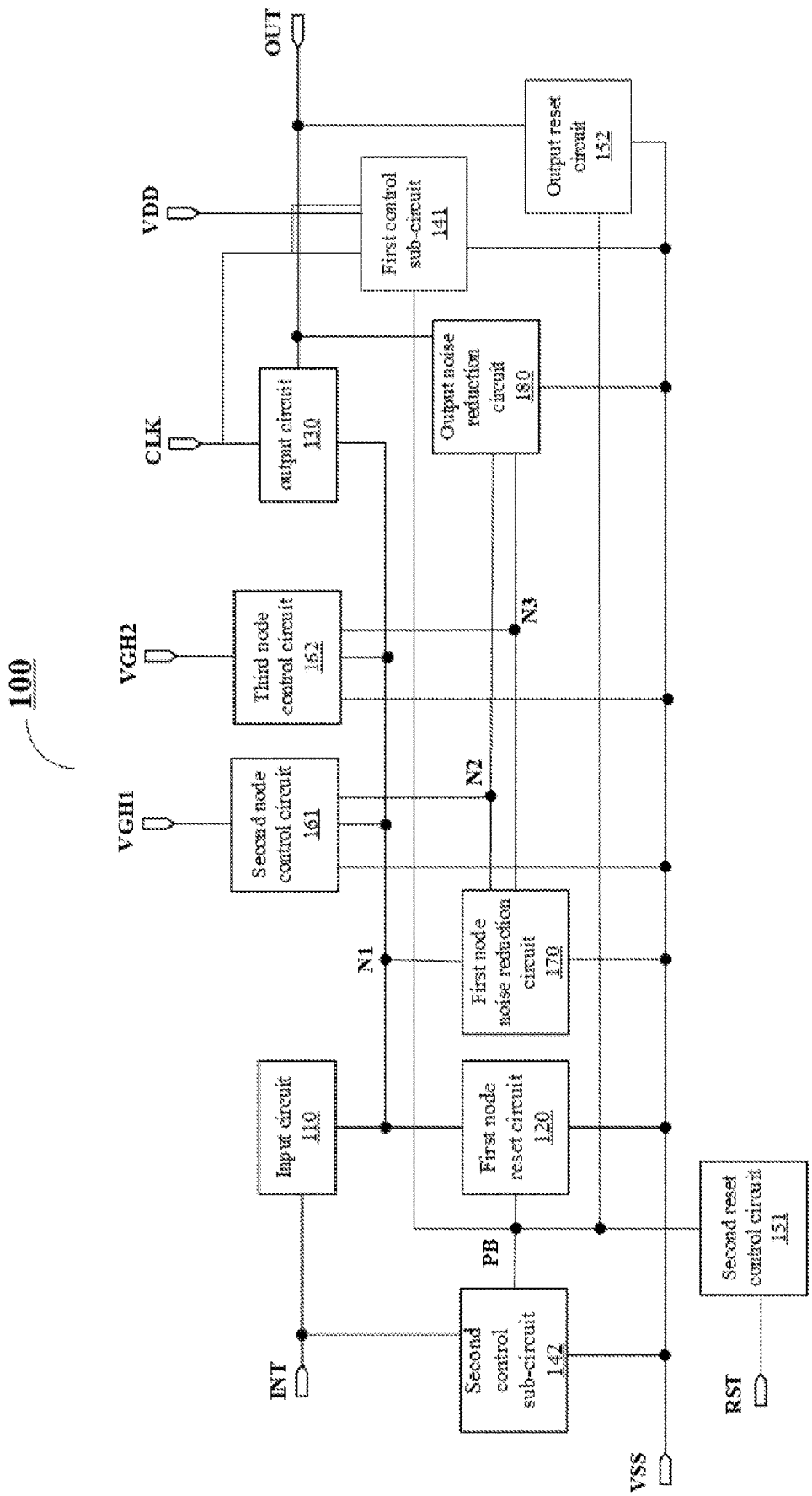
FIG. 5B is a schematic diagram of further still another shift register unit provided by at least one embodiment of the present disclosure.

FIG. 5A is a schematic diagram of further still another shift register unit provided by at least one embodiment of the present disclosure. FIG. 5B is a schematic diagram of further still another shift register unit provided by at least one embodiment of the present disclosure.

As shown in FIG. 5A, in one example, the shift register unit 100 further includes a second reset control circuit 151. It should be noted that in this example, the other circuit structures of the shift register unit 100 shown in FIG. 5A are basically the same as those of the shift register unit 100 shown in FIG. 4, and will not be repeated here.

The second reset control circuit 151 is connected to the reset control node PB and is configured to further control the level of the reset control node PB in response to a reset signal. For example, the second reset control circuit 151 is connected to the reset control node PB and a reset terminal RST, so as to be turned on under the control of the reset signal input from the reset terminal RST, so that the reset terminal RST and the reset control node PB are electrically connected to control the level of the reset control node PB at an effective level to control the first node N1 to be reset by the first node reset circuit 120. For example, the reset terminal RST is connected with the output terminal of the next shift register unit that is cascaded with the reset terminal RST, thus further ensuring the control of the reset control node PB in a reset phase.

For example, as shown in FIG. 5A, in another example, the shift register unit 100 further includes an output reset circuit 152. The output reset circuit 152 is connected to the reset control node PB and the output terminal OUT, and is configured to reset the output terminal OUT under the control of the level of the reset control node PB. For example, the output reset circuit 152 is connected to the reset control node PB, the second voltage terminal VSS or a separately provided voltage terminal (e.g., a low voltage terminal), and the output terminal OUT, and is configured to be turned on in a case where the reset control node PB is, for example, at a high level, so that the output terminal OUT is connected to the second voltage terminal VSS or the separately provided voltage terminal to reset the output terminal OUT, thereby further avoiding erroneous output of the shift register unit in the non-output phase.

For example, as shown in FIG. 5A, in another example, the shift register unit 100 further includes a second node control circuit 161, a first node noise reduction circuit 170, and an output noise reduction circuit 180.

In this example, the second node control circuit 161 is connected to the first node N1 and a second node N2 (for example, in a case where the first node N1 is a pull-up node, the second node N2 is a pull-down node), and is configured to control a level of the second node N2 under the control of the level of the first node N1. For example, in one example, the second node control circuit 161 is connected to the first node N1, the second node N2, the second voltage terminal VSS or a separately provided voltage terminal (e.g., a low voltage terminal), and a third voltage terminal VGH1 or a separately provided voltage terminal (e.g., a high voltage terminal), and is configured to connect the second node N2 with the third voltage terminal. VGH1 or the separately provided voltage terminal in a case where the first node N1 is at a low level, for example, to pull up the level of the second node N2 to a high level; and in a case where the first node N1 is at a high level, for example, the second node N2 is connected to the second voltage terminal VSS or the voltage terminal provided separately, thereby pulling down the level of the second node N2 to a low level.

For example, in the example of the embodiments shown in FIG. 5B, the shift register unit further includes a third node control circuit 162. For example, in this example, the third node control circuit 162 is connected to the first node N1, a third node N3 (for example, in a case where the first node N1 is a pull-up node, the third node N3 is a pull-down node), the second voltage terminal VSS or a separately provided voltage terminal (for example, a low voltage terminal), and a fourth voltage terminal VGH2 or a separately provided voltage terminal (for example, a high voltage terminal), and is configured such that in a case where the first node N1 is, for example, at a low level, the third node N3 is connected to the fourth voltage terminal VGH2 or the voltage terminal provided separately, thereby pulling up a level of the third node N3 to a high level, and in a case where the first node N1 is, for example, at a high level, the third node N3 is connected to the second voltage terminal VSS or the voltage terminal provided separately, thereby pulling down the level of the third node N3 to a low level.

For example, in the example shown in FIG. 5B, the third voltage terminal VGH1 and the fourth voltage terminal VGH2 may be set to alternately input a voltage at a high level, that is, in a case where the third voltage terminal VGH1 inputs a voltage at a high level, the fourth voltage terminal VGH2 inputs a voltage at a low level, and in a case where the third voltage terminal VGH1 inputs a voltage at a low level, the fourth voltage terminal VGH2 inputs a voltage at a high level, so that the second node N2 and the third node N3 alternately operate, and the transistors connected thereto can alternately operate to prolong the service life of these transistors. For example, in another example, the third voltage terminal VGH1 and the fourth voltage terminal VGH2 may also be replaced by clock signal terminals which alternately provide a voltage at a high level (a DC low level in a case where the implemented transistor is of the P type), and the embodiments of the present disclosure are not limited to this.

The first node noise reduction circuit 170 is connected to the first node N1 and the second node N2, and is configured to reduce noise at the first node N1 under the control of the level of the second node N2. For example, the first node noise reduction circuit 170 is connected to the first node N1, the second node N2, and the second voltage terminal VSS or a separately provided voltage terminal (e.g., a low voltage terminal), and is configured to be turned on in a case where the second node N2 is at a high level, for example, so that the first node N1 is connected to the second voltage terminal VSS or the separately provided voltage terminal, and the level of the first node N1 is pulled down to a low level to realize noise reduction on the first node N1.

The output noise reduction circuit 180 is connected to the second node N2 and the output terminal OUT, and is configured to reduce noise at the output terminal OUT under the control of the level of the second node N2. For example, the output noise reduction circuit 180 is connected to the second node N2, the second voltage terminal VSS or a separately provided voltage terminal (e.g., a low voltage terminal), and the output terminal OUT and is configured to be turned on in a case where the second node N2 is at a high level, for example, so that the output terminal OUT is connected to the second voltage terminal VSS or the separately provided voltage terminal to realize noise reduction at the output terminal OUT.

As shown in FIG. 5B, in another example, the output noise reduction circuit 180 is also connected to the third node N3 and the output terminal OUT, and is configured to reduce the noise at the output terminal OUT under the control of the level of the third node N3.

For example, the first voltage terminal VDD is configured to provide a DC high-level signal. For example, the DC high-level signal is referred to as a first voltage here. For example, the following embodiments are the same as this and will not be described again.

For example, the second voltage terminal VSS is configured to provide a DC low-level signal (e.g., lower than or equal to the low-level portion of the clock signal), such as to be grounded. Here, the DC low-level signal is referred to as a second voltage, e.g., the second voltage is lower than the first voltage. The following embodiments are the same as the above and will not be described again.

For example, the third voltage terminal VGH1 is configured to provide a DC high-level signal, and the signal provided by the third voltage terminal VGH1 is referred to as a third voltage. The fourth voltage terminal VGH2 is also configured to provide a DC high-level signal, and the signal provided by the fourth voltage terminal VGH2 is referred to as a fourth voltage. For example, the third voltage and the fourth voltage may be the same voltage and may both be greater than the second voltage, and the following embodiments are the same as the above and will not be described again.

Please note that the "effective level" of the shift register unit provided in the embodiments of the present disclosure refers to a level that enables the operated transistor which is included in the shift register unit to be turned on, and correspondingly the "invalid level" refers to a level that cannot enable the operated transistor which is included in the shift register unit to be turned on (i.e., the transistor is turned off). The effective level may be higher or lower than the invalid output level depending on factors such as the type of transistors (N type or P type) in the circuit structure of the shift register unit. Generally, the effective level of the square wave pulse signal used in the shift register unit during operation corresponds to the level of the square wave pulse portion of the square wave pulse signal, and the invalid level corresponds to the level of the non-square-wave pulse portion.

Figure 6:
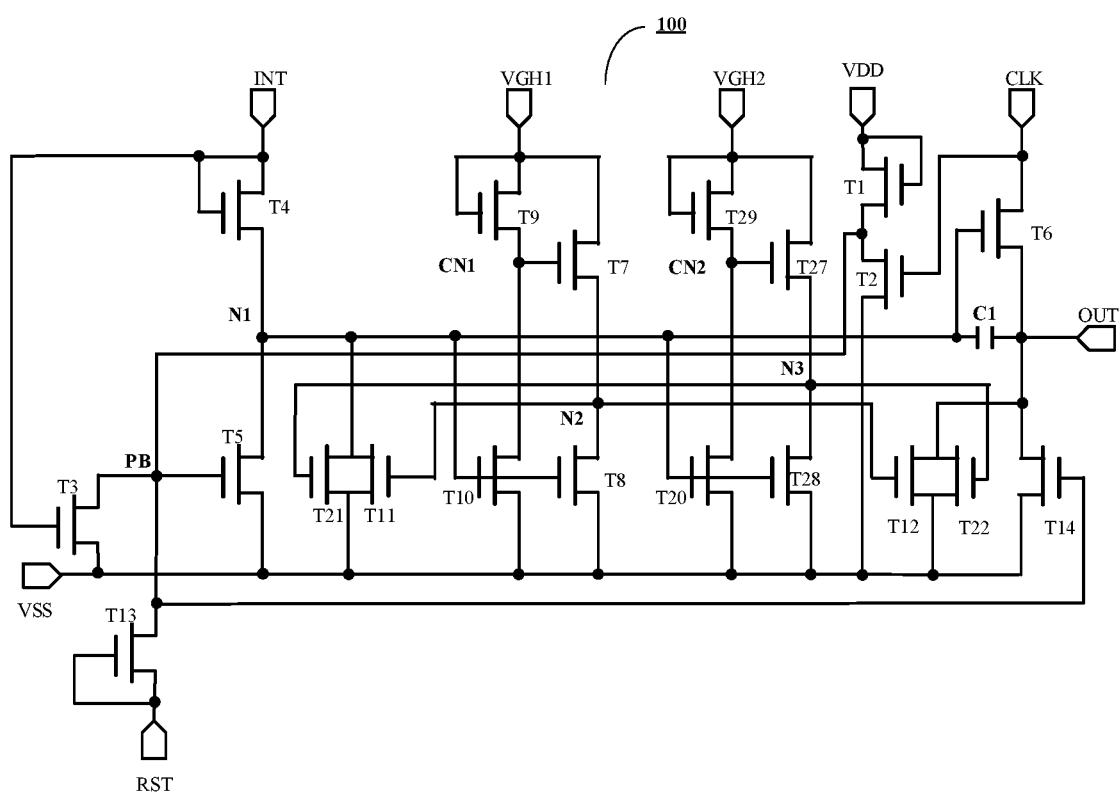
FIG. 6 is a circuit schematic diagram of a specific implementation example of the shift register unit shown in FIG. 5B.

FIG. 6 is a circuit schematic diagram of a specific implementation example of the shift register unit of the embodiments shown in FIG. 5B, and the shift register units of embodiments shown in other figures may be implemented in the same or similar manner. As shown in FIG. 6, the shift register unit 100 includes first to twenty-ninth transistors T1-T29, and further includes a first capacitor C1. It should be noted that in the following description, each transistor is illustrated as an N-type transistor, but this does not constitute a limitation to the embodiments of the present disclosure.

The input circuit 110 may be implemented as a fourth transistor T4. A gate electrode of the fourth transistor T4 and a first electrode of the fourth transistor T4 are electrically connected to each other and are both configured to be connected to the input terminal INT to receive the input signal, and a second electrode of the fourth transistor T4 is configured to be connected to the first node N1, so that in a case where the fourth transistor T4 is turned on due to a turn-on signal (e.g., a high level signal) that is received at the input terminal INT, the turn-on signal is used to charge the first node N1 to being at a high level. For example, the gate electrode of the fourth transistor T4 and the first electrode of the fourth transistor T4 may also be connected to the input terminal INT and another high voltage terminal (e.g., the third voltage terminal VGH1 or the fourth voltage terminal VGH2), respectively. The embodiments of the present disclosure are not limited to this.

The first node reset circuit 120 may be implemented as a fifth transistor T5. A gate electrode of the fifth transistor T5 is connected to the reset control node PB, a first electrode of the fifth transistor T5 is connected to the first node N1, and a second electrode of the fifth transistor T5 is connected to the second voltage terminal VSS to receive the second voltage. In a case where the fifth transistor T5 is turned on under the control of the level of the reset control node PB, the first node N1 and the second voltage terminal VSS are electrically connected, so that the first node N1 can be reset.

For example, in the shift register unit shown in FIG. 3, in a phase where the first node N1 is pre-charged by the input circuit 110, the input signal is at a high level and the clock signal is at a low level (i.e., the reset control node PB is at a high level). Therefore, the fourth transistor T4 and the fifth transistor T5 are respectively turned on under the control of the input signal and under the control of the reset control node PB. For example, the parameters (e.g., width-to-length ratios of channels) of the fourth transistor T4 and the fifth transistor T5 can be designed such that where the fourth transistor T4 and the fifth transistor T5 are simultaneously turned on, and the first node N1 is connected to the input terminal INT, so that the first node N1 can be charged.

The output circuit 130 may be implemented as a sixth transistor T6 and a first capacitor C1. A gate electrode of the sixth transistor T6 is connected to the first node N1, a first electrode of the sixth transistor T6 is connected to the clock signal terminal CLK to receive the clock signal, and a second electrode of the sixth transistor T6 is connected to the output terminal OUT. A first electrode of the first capacitor C1 is connected to the first node N1, and a second electrode of the first capacitor C1 is connected to the output terminal OUT. It should be noted that the shift register unit may also include more output signals and more corresponding output terminals without being limited thereto.

The inverting circuit included in the first control sub-circuit 141 that is included in the first reset control circuit 140 may be implemented as a first transistor T1 and a second transistor T2. A gate electrode of the first transistor T1 and a first electrode of the first transistor T1 are electrically connected and are configured to be respectively connected to the first voltage terminal VDD to receive the first voltage, and a second electrode of the first transistor T1 is connected to the reset control node PB. A gate electrode of the second transistor T2 is connected to the clock signal terminal CLK to receive the clock signal, a first electrode of the second transistor T2 is connected to the reset control node PB, and a second electrode of the second transistor T2 is connected to the second voltage terminal VSS to receive the second voltage.

For example, the first transistor T1 is always in a turned-on state in response to the first voltage supplied from the first voltage terminal VDD, so that in a case where the second transistor T2 is turned off in response to the clock signal at an invalid level that is supplied from the clock signal terminal CLK, the reset control node PB is connected to the first voltage terminal VDD, thereby controlling the reset control node PB at the first voltage. Parameters (e.g., width-to-length ratios of channels) of the first transistor T1 and the second transistor T2 are designed such that where the second transistor T2 is turned on in response to the clock signal at an effective level provided by the clock signal terminal CLK, the reset control node PB is connected to the second voltage terminal VSS, and the level of the reset control node PB becomes the lower second voltage, thereby controlling the reset control node PB at the second voltage.

For example, in a case where the clock signal is at an effective level (e.g., a high level), the second transistor T2 is turned on, and the reset control node PB can be connected to the second voltage terminal VSS through the second transistor T2 by designing width-to-length ratios of the channels of the second transistor T2 and the turned-on first transistor T1, so that the level of the reset control node PB is pulled down to a low level. So in a case where the output circuit 130 of the shift register unit 100 outputs the clock signal at an effective level, the level of the reset control node PB controls the first node reset circuit 120 to be turned off, so that the level of the first node N1 is not affected, and the normal output of the clock signal is ensured.

The second control sub-circuit 142 that is included in the first reset control circuit 140 may be implemented as a third transistor T3. A gate electrode of the third transistor T3 is connected to the input terminal INT to receive the input signal, a first electrode of the third transistor T3 is connected to the reset control node PB, and a second electrode of the third transistor T3 is connected to the second voltage terminal VSS to receive the second voltage.

For example, the first transistor is always in a turned-on state in response to the first voltage supplied from the first voltage terminal VDD, so that in a case where the third transistor T3 is turned off in response to the input signal at an invalid level supplied from the input terminal INT (for example, in a case where the second transistor T2 is included, the second transistor T2 is also turned off in response to the clock signal at the invalid level supplied from the clock signal terminal CLK), the reset control node PB is connected to the first voltage terminal VDD to control the reset control node PB at the first voltage. Parameters (e.g., width-to-length ratios of channels) of the first transistor T1 and the third transistor T3 are designed such that where the third transistor T3 is turned on in response to the input signal at an effective level that is provided by the input terminal INT, the reset control node PB is connected to the second voltage terminal VSS, and the level of the reset control node PB becomes the lower second voltage, thereby controlling the reset control node PB at the second voltage.

For example, in a case where the input signal is at an effective level (e.g., a high level), the third transistor T3 is turned on. The reset control node PB can be connected to the second voltage terminal VSS by designing width-to-length ratios of channels of the third transistor T3 and the turned-on first transistor T1, so that the level of the reset control node PB is pulled down to a low level to control the first node reset circuit 120 to be turned off through the level of the reset control node PB during the pre-charging phase where the input circuit 110 of the shift register unit 100 charges the first node N1, thereby not affecting the charging of the first node N1 by the input signal.

The second reset control circuit 151 may be implemented as a thirteenth transistor T13. A gate electrode of the thirteenth transistor T13 and a first electrode of the thirteenth transistor T13 are connected and are configured to be respectively connected to the reset terminal RST to receive the reset signal, and a second electrode of the thirteenth transistor T13 is connected to the reset control node PB. For example, in a case where the thirteenth transistor T13 is turned on in response to the reset signal, the reset control node PB is connected to the reset terminal RST to control the reset control node PB at an effective level, so that the first node reset circuit 120 is turned on in response to the effective level of the reset control node PB to reset the first node N1.

The output reset circuit 152 may be implemented as a fourteenth transistor T14. A gate electrode of the fourteenth transistor T14 is connected to the reset control node PB, a first electrode of the fourteenth transistor T14 is connected to the output terminal OUT, and a second electrode of the fourteenth transistor T14 is connected to the second voltage terminal VSS to receive the second voltage. For example, the fourteenth transistor T14 is turned on under the control of the reset control node PB to connect the output terminal OUT with the second voltage terminal VSS, thereby resetting the output terminal OUT.

The second node control circuit 161 may be implemented as a seventh transistor T7, an eighth transistor T8, a ninth transistor T9, and a tenth transistor T10. A gate electrode of the seventh transistor T7 is connected to a first control node CN1, a first electrode of the seventh transistor T7 is connected to the third voltage terminal VGH1 to receive the third voltage, and a second electrode of the seventh transistor T7 and the second node N2 are connected. A gate electrode of the eighth transistor T8 is connected to the first node N1, a first electrode of the eighth transistor T8 is connected to the second node N2, and a second electrode of the eighth transistor T8 is connected to the second voltage terminal VSS to receive the second voltage. A gate electrode of the ninth transistor T9 and a first electrode of the ninth transistor T9 are electrically connected to each other, and are both configured to be connected to the third voltage terminal VGH1 to receive the third voltage, and a second electrode of the ninth transistor T9 is connected to the first control node CN1. A gate electrode of the tenth transistor T10 is connected to the first node N1, a first electrode of the tenth transistor T10 is connected to the first control node CN1, and a second electrode of the tenth transistor T10 is connected to the second voltage terminal VSS to receive the second voltage.

The third node control circuit 162 includes a twenty-seventh transistor T27, a twenty-eighth transistor T28, a twenty-ninth transistor T29, and a twentieth transistor T20. A gate electrode of the twenty-seventh transistor T27 is connected to a second control node CN2, a first electrode of the twenty-seventh transistor T27 is connected to the fourth voltage terminal VGH2 to receive the fourth voltage, and a second electrode of the twenty-seventh transistor T27 and the third node N3 are connected. A gate electrode of the twenty-eighth transistor T28 is connected to the first node N1, a first electrode of the twenty-eighth transistor T28 is connected to the third node N3, and a second electrode of the twenty-eighth transistor T28 is connected to the second voltage terminal VSS to receive the second voltage. A gate electrode of the twenty-ninth transistor T29 and a first electrode of the twenty-ninth transistor T29 are electrically connected to each other, and are both configured to be connected to the fourth voltage terminal VGH2 to receive the fourth voltage, and a second electrode of the twenty-ninth transistor T29 is connected to the second control node CN2. A gate electrode of the twentieth transistor 120 is connected to the first node N1, a first electrode of the twentieth transistor T20 is connected to the second control node CN2, and a second electrode of the twentieth transistor T20 is connected to the second voltage terminal VSS to receive the second voltage.

The first node noise reduction circuit 170 may be implemented as an eleventh transistor T11 and a twenty-first transistor T21. A gate electrode of the eleventh transistor T11 is connected to the second node N2, a first electrode of the eleventh transistor T11 is connected to the first node N1, and a second electrode of the eleventh transistor T11 is connected to the second voltage terminal VSS to receive the second voltage. The eleventh transistor T11 is turned on in a case where the second node N2 is at a high level, and connects the first node N1 and the second voltage terminal VSS, so that the level of the first node N1 can be pulled down to realize noise reduction. A gate electrode of the twenty-first transistor T21 is connected to the third node N3, a first electrode of the twenty-first transistor T21 is connected to the first node N1, and a second electrode of the twenty-first transistor T21 is connected to the second voltage terminal VSS to receive the second voltage. The twenty-first transistor T21 is turned on in a case where the third node N3 is at a high level, and connects the first node N1 and the second voltage terminal VSS, so that the level of the first node N1 can be pulled down to realize noise reduction. For example, the eleventh transistor T11 and the twenty-first transistor T21 alternately operate under the control of the level of the second node N2 and under the control of the level of the third node N3, respectively, to prolong the service life of these transistors.

The output noise reduction circuit 180 may be implemented as a twelfth transistor T12 and a twenty-second transistor T22. A gate electrode of the twelfth transistor T12 is connected to the second node N2, a first electrode of the twelfth transistor T12 is connected to the output terminal OUT, and a second electrode of the twelfth transistor T12 is connected to the second voltage terminal VSS to receive the second voltage. The twelfth transistor T12 is turned on in a case where the second node N2 is at a high level, and connects the output terminal OUT and the second voltage terminal VSS, thereby reducing noise at the output terminal OUT. A gate electrode of the twenty-second transistor T22 is connected to the third node N3, a first electrode of the twenty-second transistor T22 is connected to the output terminal OUT, and a second electrode of the twenty-second transistor T22 is connected to the second voltage terminal VSS to receive the second voltage. The twenty-second transistor T22 is turned on in a case where the third node N3 is at a high level, and connects the output terminal OUT and the second voltage terminal VSS, thereby reducing noise at the output terminal OUT. For example, the twelfth transistor T12 and the twenty-second transistor T22 alternately operate under the control of the level of the second node N2 and under the control of the level of the third node N3, respectively, to prolong the service life of these transistors.

It should be noted that the circuit structures of the shift register units shown in FIG. 2 to FIG. 5A are similar to the circuit structure, which is shown in FIG. 6, of the shift register unit shown in FIG. 5B and will not be repeated here.

In the embodiments of the present disclosure, for example, when each circuit is implemented as an N-type transistor, the term "pull-up" means charging a node or an electrode of a transistor so as to raise the absolute value of the level of the node or the electrode, thereby realizing the operation (e.g., turn-on) of the corresponding transistor; and the term "pull-down" refers to discharging a node or an electrode of a transistor so that the absolute value of the level of the node or the electrode decreases, thereby realizing the operation (e.g., turn-off) of the corresponding transistor.

For another example, when each circuit is implemented as a P-type transistor, the term "pull-up" means discharging a node or an electrode of a transistor so that the absolute value of the level of the node or the electrode decreases, thereby realizing the operation (e.g., turn-on) of the corresponding transistor; and the term "pull-down" means to charge a node or an electrode of a transistor so that the absolute value of the level of the node or the electrode increases, thereby realizing the operation (e.g., turn-off) of the corresponding transistor.

It should be noted that in the description of various embodiments of the present disclosure, the first node N1, the second node N2, and the third node N3 do not represent actual components, but represent the junction points of related electrical connections in the circuit diagrams.

It should be noted that the transistors used in the embodiments of the present disclosure can be thin film transistors, field effect transistors or other switching components with the same characteristics, and the embodiments of the present disclosure are all described with thin film transistors as examples. The source and drain of the transistor used here can be symmetrical in structure, so the source and drain can be structurally indistinguishable. In the embodiments of the present disclosure, in order to distinguish the two electrodes of the transistor except the gate electrode, one electrode is directly described as the first electrode and the other electrode is described as the second electrode.

In addition, the transistors in the embodiments of the present disclosure are all described by taking N-type transistors as examples, in which the first electrode of the transistor is a drain electrode and the second electrode of the transistor is a source electrode. It should be noted that the present disclosure includes but is not limited to this. For example, one or more transistors in the shift register unit 100 provided by the embodiments of the present disclosure may also adopt P-type transistors. In this case, the first electrode of the transistor is the source electrode and the second electrode of the transistor is the drain electrode. All that is required is to connect the electrodes of the transistors of selected type with reference to the respective electrodes of the corresponding transistors in the embodiments of the present disclosure, and make the corresponding voltage terminals provide the corresponding high voltage or low voltage. When an N-type transistor is used, Indium Gallium Zinc Oxide (IGZO) can be used as the active layer of the thin film transistor. Compared with using Low Temperature Poly Silicon (LTPS) or amorphous silicon (such as hydrogenated amorphous silicon) as the active layer of the thin film transistor, the size of the transistor can be effectively reduced and leakage current can be prevented.

Figure 7:
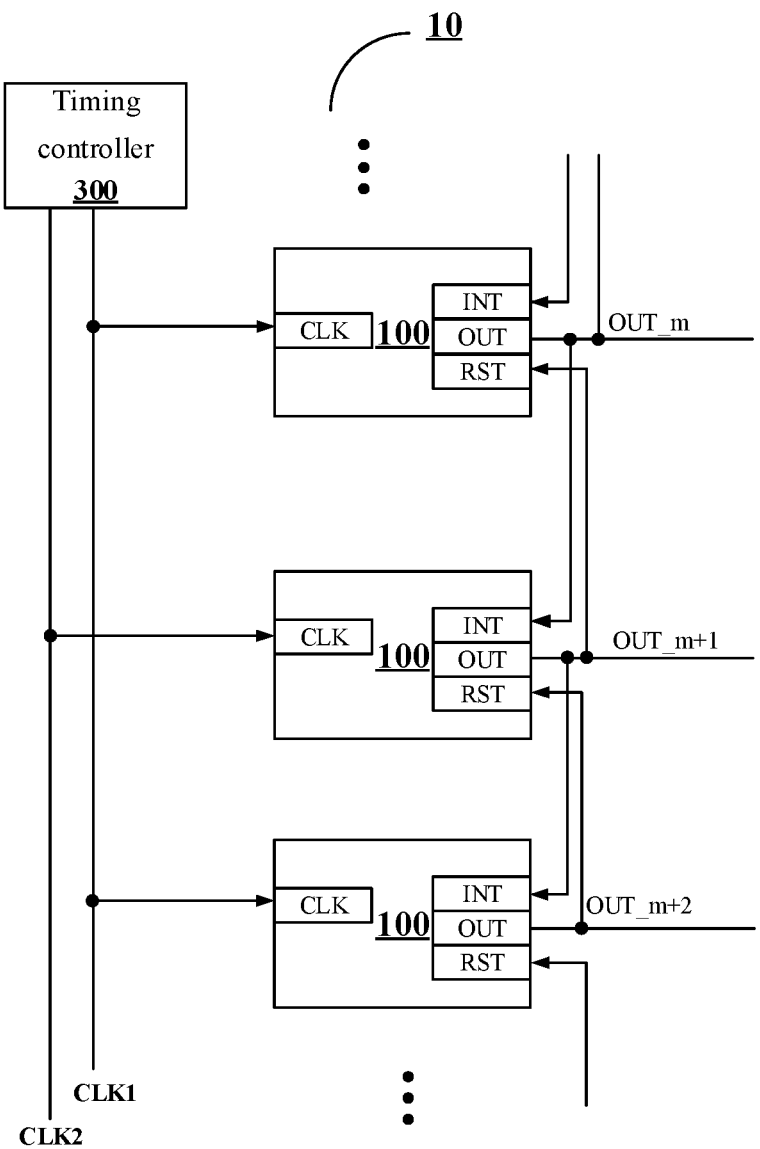
FIG. 7 is a schematic diagram of a gate driving circuit provided by at least one embodiment of the present disclosure.

At least one embodiment of the present disclosure also provides a gate driving circuit. FIG. 7 is a schematic diagram of a gate driving circuit provided by an embodiment of the present disclosure. As shown in FIG. 7, the gate driving circuit 10 includes a plurality of cascaded shift register units 100, and any one or the plurality of the shift register units 100 may adopt the structure of the shift register unit 100 provided in any embodiment of the present disclosure or a variation thereof, for example, the shift register unit 100 shown in FIG. 6 may be adopted. For example, the gate driving circuit 10 can be directly integrated on the array substrate of the display device by the same semiconductor process as the thin film transistor to realize the driving function of progressive or interlaced scanning.

Except for the shift register unit of the first stage, the input terminals INT of the shift register units of the other stages are connected with the output terminals OUT of the shift register units of the preceding stage. Except for the last shift register unit, the reset terminals RST of the other shift register units are connected to the output terminals OUT of the shift register units of the next stage.

As shown in FIG. 7, the gate driving circuit 10 further includes a first clock signal line CLK1 and a second clock signal line CLK2. For example, the first clock signal line CLK1 and the second clock signal line CLK2 are respectively connected to clock signal terminals CLK of the plurality of cascaded shift register units to provide clock signals. For example, the reset control signal includes a clock signal provided by the first clock signal line CLK1 and a clock signal provide by the second clock signal line CLK2. It should be noted that the gate driving circuit 10 may also include four, six or eight and more clock signal lines. The number of clock signal lines depends on the specific situation, and the embodiments of the present disclosure are not limited here.

For example, as shown in FIG. 7, each of the shift register units further includes a clock signal terminal CLK and is configured to be connected to the first clock signal line CLK1 or the second clock signal line CLK2 to receive a first clock signal or a second clock signal. The first clock signal line CLK1 is connected to a clock signal terminal CLK of a shift register unit of a (2n−1 (n is an integer greater than 0))-th stage, and the second clock signal line CLK2 is connected to a clock signal terminal CLK of a shift register unit of a (2n)-th stage. It should be noted that the embodiments of the present disclosure include but are not limited to the above-mentioned connection mode. For example, the first clock signal line CLK1 may be connected to a clock signal terminal CLK of a shift register unit of a (2n)-th stage, and the second clock signal lis e CLK2 may be connected to a clock signal terminal CLK of a shift register unit of a (2n−1)-th stage.

It should be noted that an output terminal OUT_m (m is an integer greater than 0) shown in FIG. 7 represents an output terminal of a shift register unit of an m-th stage, an output terminal OUT_m+1 represents an output terminal of a shift register unit of an (m+1)-th stage, an output terminal OUT_m+2 represents an output terminal of a shift register unit of an (m+2)-th stage, . . . . The reference symbols in the following embodiments are similar to this and will not be repeated here.

For example, an input terminal INT of a shift register unit of the first stage may be configured to receive a trigger signal STV, a reset terminal RST of a shift register unit of the last stage may be configured to receive a reset signal, and the trigger signal STV and the reset signal are not shown in FIG. 7 for the sake of brevity.

For example, the gate driving circuit 10 further includes a first voltage line, a second voltage line, a third voltage line, and a fourth voltage line (not shown in the figure). For example, the first voltage line is connected to the first voltage terminal VDD and is configured to provide the first voltage; the second voltage line is connected to the second voltage terminal VSS and is configured to provide the second voltage; the third voltage line is connected to the third voltage terminal VGH1 and is configured to provide the third voltage; and the fourth voltage line is connected to the fourth voltage terminal VGH2 and is configured to provide the fourth voltage.

For example, as shown in FIG. 7, the gate driving circuit 10 may further include a timing controller 300. For example, the timing controller 300 may be configured to be connected to the first clock signal line CLK1 and the second clock signal line CLK2 to provide clock signals to each shift register unit. The gate driving circuit 10 may also be configured to be connected to the first voltage line, the second voltage line, the third voltage line, and the fourth voltage line to respectively supply the first voltage to the fourth voltage to each shift register unit 100. For example, the timing controller 300 may also be configured to provide the trigger signal STV and the reset signal.

Figure 8:
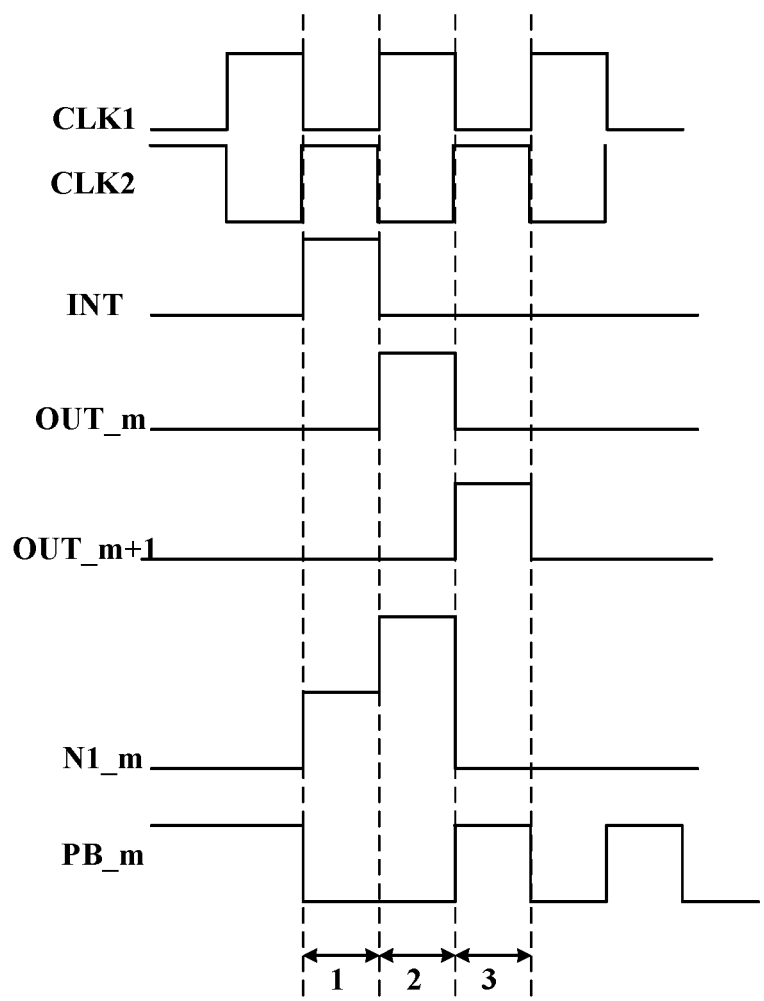
FIG. 8 is a timing diagram of signals corresponding to an example of operation of the gate driving circuit shown in FIG. 7.

For example, the timing of clock signals provided by the first clock signal line CLK1 and the second clock signal line CLK2 may adopt the signal timing shown in FIG. 8 to realize the function of the gate driving circuit 10 to output a gate scanning signal line by line. It should be noted that a high level and a low level in the timing diagram of signals shown in FIG. 8 are only schematic and do not represent the real level value or relative proportion. Corresponding to the above examples, a high level signal corresponds to a turn-on signal of the N-type transistor, and a low level signal corresponds to a turn-off signal of the N-type transistor.

For example, in one example, the operating principle of the shift register unit of the m-th stage of the gate driving circuit 10 shown in FIG. 7 will be described below with reference to the timing diagram of signals shown in FIG. 8. For example, the shift register unit of the m-th stage may adopt the circuit structure shown in FIG. 6, and the operating principle of the shift register unit 100 is as follows.

In a first phase 1, the input terminal INT provides a high level signal, and the input circuit 110 is turned on under the control of the high level signal provided by the input terminal INT, so that the high level signal provided by the input terminal INT charges the first node N1 in, and the first node N1_m is charged to being at a first high level. Simultaneously, the second control sub-circuit 142 is turned on under the control of the high level signal provided by the input terminal INT, so that the reset control node PB_m is connected to the second voltage terminal VSS, and the reset control node PB_m is at a low level, thereby preventing the first node reset circuit 120 from being turned on under the control of the level of the reset control node PB_m to affect the charging of the first node N1. In this phase, the first clock signal line CLK1 provides a low level signal. Since the clock signal terminal CLK of the shift register unit 100 of the m-th stage is connected to the first clock signal line CLK1, in this phase, the low level signal is input from the clock signal terminal CLK of the shift register unit 100 of the m-th stage. Therefore, under the control of the first high level of the first node N1_m, the low level signal that is input by the clock signal terminal CLK is output to the output terminal OUT_m of the shift register unit 100 of the m-th stage. It should be noted that the high level and the low level in the timing diagram of signals shown in FIG. 8 are only schematic and do not represent the real level value or relative proportion. Corresponding to the above example, the high level signal corresponds to the turn-on signal of the N-type transistor, and the low level signal corresponds to the turn-off signal of the N-type transistor.

For example, in the shift register unit shown in FIG. 3, in this phase, the input terminal INT provides a high level signal, and the fourth transistor T4 (the input circuit 110) is turned on under the control of the high level signal provided by the input terminal INT. Simultaneously, since the clock signal is at a low level, the reset control node PB_m is connected to the first voltage terminal VDD, and the reset control node PB_m is at a high level, therefore, the fifth transistor T5 (the first node reset circuit 120) is turned on under the control of the reset control node PB_m. For example, the first node N1 may be connected to the input terminal INT in a case where the fourth transistor T4 and the fifth transistor T5 are simultaneously turned on by designing parameters (e.g., width-to-length ratios of channels) of the fourth transistor T4 and the fifth transistor T5, so that the first node N1 may be charged and the level of the first node N1_$m$ is charged to the first high level.

In a second phase 2, the first clock signal line CLK1 provides a high level signal, so the clock signal terminal CLK of the shift register unit 100 of the m-th stage inputs the high level signal, and the first node N1_$m$ is further charged to being at a second high level due to the bootstrap effect of the capacitor C1, so the high level signal input by the clock signal terminal CLK is output to the output terminal OUT_m of the shift register unit 100 of the m-th stage under the control of the second high level of the first node N1_$m$. Simultaneously, since the inverting circuit that is included in the first control sub-circuit 141 applies the inverted signal (i.e., a low level signal) of the clock signal to the reset control node PB_m, the reset control node PB_m is at a low level, thereby preventing the first node reset circuit 120 from being turned on under the control of the level of the reset control node PB to affect the output of the output terminal OUT.

Moreover, in this phase, the second clock signal line CLK2 provides a low level signal. Since the clock signal terminal CLK of the shift register unit 100 of the (m+1)-th stage is connected to the second clock signal line CLK2, the clock signal terminal CLK of the shift register unit 100 of the (m+1)-th stage is input with the low level signal in this phase. And since the high level signal that is output by the output terminal OUT in of the shift register unit 100 of the m-th stage is taken as the input signal of the shift register unit 100 of the (m+1)-th stage, so that the level of the first node N1 of the shift register unit 100 of the (m+1)-th stage is pulled up to the first high level by the input signal, and the low level signal input by the clock signal terminal CLK of the shift register unit 100 of the (m+1)-th stage is output to the output terminal OUT_m+1 under the control of the first high level of the first node N1 of the shift register unit 100 of the (m+1)-th stage.

In a third phase 3, the first clock signal line CLK1 inputs a low level signal, so the clock signal terminal CLK of shift register unit 100 of the m-th stage is input with the low level signal. Since the inverting circuit included in the first control sub-circuit 141 applies the inverted signal (i.e., the high level signal) of the clock signal to the reset control node PB_m, the reset control node PB_m is at a high level in this phase, so that the first node reset circuit 120 is turned on under the control of the level of the reset control node PB, and the first node N1_$m$ is connected to the second voltage terminal VSS to reset the first node N1_$m$. The reset operation on the first node N1 thus performed is not related to the reset signal, but is only related to the reset control signal, thus avoiding that where an output of the output terminal OUT of the shift register unit 100 of the (m+1)th stage is abnormal, the reset signal cannot be supplied to the reset terminal RST of the shift register unit 100 of the mth stage to cause the output of the output terminal OUT to be abnormal. Simultaneously, in this phase, the second clock signal line CLK2 provides a high level signal, so the clock signal terminal CLK of the shift register unit 100 of the (m+1)th stage inputs the high level signal, and the first node N1 of the shift register unit 100 of the (m+1)th stage is further charged to being at the second high level due to the bootstrap effect of the capacitor C1, so under the control of the second high level of the first node N1, the high level signal input by the clock signal terminal CLK of the shift register unit 100 of the (m+1)th stage is output to the output terminal Out_m+1 of the shift register unit 100 of the (m+1)th stage. Since the output terminal OUT_m+1 of the shift register unit 100 of the (m+1)th stage is connected to the reset terminal RST of the shift register unit 100 of the mth stage, under the control of the high level signal output from the output terminal OUT_m+1 of the shift register unit 100 of the (m+1)th stage, the second reset control circuit 151 of the shift register unit 100 of the m-th stage is turned on, and the level of the reset control node PB_m of the shift register unit 100 of the m-th stage becomes a high level. The first node reset circuit 120 of the shift register unit 100 of the m-th stage may also reset the first node N1_$m$ of the shift register unit 100 of the m-th stage under the control of the level of the reset control node PB_m.

It should be noted that in a case where the gate driving circuit 10 provided in the embodiments of the present disclosure is used to drive a display panel, the gate driving circuit 10 may be disposed on one side of the display panel. For example, the display panel includes a plurality of rows of gate lines, and a second output terminal of each voltage conversion circuit in the gate driving circuit 10 may be configured to be sequentially connected to the plurality of rows of gate lines for outputting gate scanning signals. It should be noted that the gate drive circuits 10 may be provided on both sides of the display panel to realize double-sided driving, and the embodiments of the present disclosure do not limit the arrangement of the gate driving circuits 10.

Figure 9:
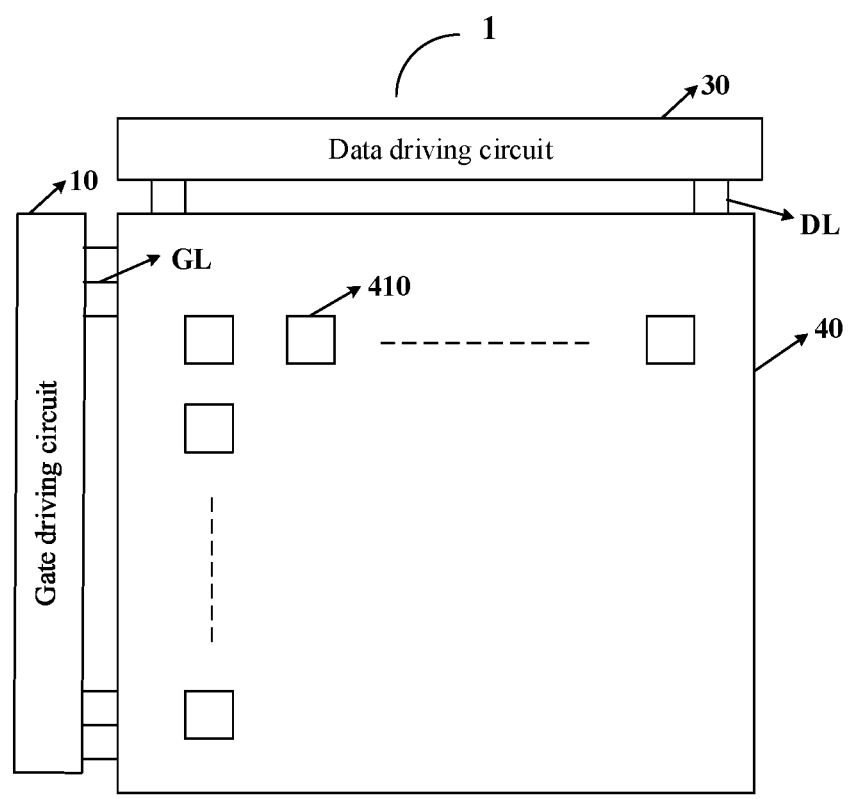
FIG. 9 is a schematic diagram of a display device provided by at least one embodiment of the present disclosure.

At least one embodiment of the present disclosure also provides a display device 1. As shown in FIG. 9, the display device 1 includes the gate driving circuit 10 provided in the above embodiments of the present disclosure. The display device 1 further includes a display panel 40, and the display panel 40 includes an array of a plurality of sub-pixel units 410. For example, the display device 1 may further include a data driving circuit 30. The data driving circuit 30 is used for providing data signals to the array of pixels; and the gate driving circuit 10 is used to provide driving signals to the array of pixels, for example, the driving signals may drive scanning transistors and sensing transistors in the sub-pixel units 410. The data driving circuit 30 is electrically connected to the sub-pixel units 410 through data lines DL, and the gate driving circuit 10 is electrically connected to the sub-pixel units 410 through gate lines GL.

It should be noted that the display device 1 in the present embodiments can be any product or component with a display function such as a liquid crystal panel, a liquid crystal television, a display screen, an OLED panel, an OLED television, an electronic paper display device, a mobile phone, a tablet computer, a notebook computer, a digital photo frame, a navigator, etc. The display device 1 may also include other conventional components such as a display panel, and the embodiments of the present disclosure are not limited thereto.

The technical effect of the display device 1 provided by the embodiments of the present disclosure may refer to the corresponding description of the gate driving circuit 10 in the above embodiments, and will not be described here again.

It should be noted that the entire structure of the display device 1 is not given for clarity and conciseness. In order to realize the necessary functions of the display device, those skilled in the art can set other structures not shown according to specific application scenarios, and the embodiments of the present disclosure are not limited to this.

At least one embodiment of the present disclosure also provides a driving method that can be used to drive the shift register unit 100 provided by the embodiments of the present disclosure. For example, in one example, the driving method includes a period of time other than in a case where the input circuit 110 provides an input signal to the first node N1 and the output circuit 130 outputs an output signal under the control of the level of the first node N1 allowing that the first reset control circuit 140 to receive the reset control signal to control the level of the reset control node PB, so that the first node reset circuit 120 resets the first node N1 under the control of the level of the reset control node PB.

For example, the driving method further includes allowing the input circuit 110 to control the level of the first node N1 (e.g., to charge the first node N1) in response to the input signal); and the output circuit 130 outputs the output signal under the control of the level of the first node N1.

For example, in a phase where the input circuit 110 controls the level of the first node N1 in response to the input signal, the first reset control circuit 140 (e.g., the second control sub-circuit 142 included in the first reset control circuit 140) can control the level of the reset control node PB to an invalid level under the control of the input signal provided by the input terminal INT, thereby preventing the first node reset circuit 120 from being turned on under the control of the level of the reset control node PB to affect the charging of the first node N1.

For example, in another example, the shift register unit 100 includes a second reset control circuit 151, and the driving method further includes: allowing the second reset control circuit 151 to control the level of the reset control node PB in response to the reset signal so that the first node reset circuit 120 resets the first node N1 under the control of the level of the reset control node PB.

The technical effect of the driving method of the gate driving circuit 10 provided by the embodiments of the present disclosure can be referred to the corresponding description of the gate driving circuit 10 in the above embodiments, and will not be repeated here.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A shift register unit, comprising an input circuit, a first node reset circuit, an output circuit and a first reset control circuit,
   wherein the input circuit is connected to a first node and is configured to provide an input signal to the first node,
   the first node reset circuit is connected with the first node and a reset control node, and is configured to reset the first node under control of a level of the reset control node,
   the output circuit is connected with the first node and an output terminal, and is configured to output an output signal at the output terminal under control of a level of the first node, and
   the first reset control circuit is connected to the reset control node and is configured to control the level of the reset control node in response to a reset control signal;
   wherein the first reset control circuit comprises a first control sub-circuit;
   the first control sub-circuit is connected to the reset control node and is configured to control the level of the reset control node in response to a clock signal, and the reset control signal comprises the clock signal; and
   the output circuit outputs the clock signal as the output signal at the output terminal under control of the level of the first node;
   wherein the first control sub-circuit comprises an inverting circuit that is configured to apply an inverting signal that is inverted from the clock signal to the reset control node for controlling the level of the reset control node;
   wherein the inverting circuit comprises a first transistor and a second transistor;
   a gate electrode of the first transistor and a first electrode of the first transistor are electrically connected, and are configured to be respectively connected to a first voltage terminal to receive a first voltage, and a second electrode of the first transistor is connected to the reset control node; and
   a gate electrode of the second transistor is connected to a clock signal terminal to receive the clock signal, a first electrode of the second transistor is connected to the reset control node, and a second electrode of the second transistor is connected to a second voltage terminal to receive a second voltage;
   the first voltage terminal is configured to provide a DC high-level signal, and the first voltage comprises the DC high-level signal.

2. The shift register unit according to claim 1, wherein the first reset control circuit further comprises a second control sub-circuit; and
   the second control sub-circuit is connected to the reset control node and is configured to control the level of the reset control node in response to the input signal, and the reset control signal further comprises the input signal.

3. The shift register unit according to claim 2, wherein the second control sub-circuit comprises:
   a third transistor, of which a gate electrode is connected to an input terminal to receive the input signal, a first electrode is connected to the reset control node, and a second electrode is connected to a second voltage terminal to receive a second voltage.

4. The shift register unit according to claim 1, further comprising a second reset control circuit,
   wherein the second reset control circuit is connected to the reset control node and is configured to control the level of the reset control node in response to a reset signal.

5. The shift register unit according to claim 1, further comprising an output reset circuit, wherein the output reset circuit is connected with the reset control node and the output terminal, and is configured to reset the output terminal under control of the level of the reset control node.

6. The shift register unit according to claim 1, further comprising a second node control circuit, a first node noise reduction circuit and an output noise reduction circuit,
   wherein the second node control circuit is connected with the first node and a second node, and is configured to control a level of the second node under control of the level of the first node,
   the first node noise reduction circuit is connected with the first node and the second node, and is configured to reduce noise at the first node under control of the level of the second node, and
   the output noise reduction circuit is connected with the second node and the output terminal, and is configured to reduce noise at the output terminal under control of the level of the second node.

7. A method of driving the shift register unit according to claim 1, comprising:
   during a period other than in a case where the input circuit provides the input signal to the first node and the output circuit outputs the output signal under control of the level of the first node, allowing the first reset control circuit to receive the reset control signal to control the level of the reset control node, so that the first node reset circuit resets the first node under control of the level of the reset control node.

8. The method of driving the shift register unit according to claim 7, further comprising:
   allowing the input circuit to control the level of the first node in response to the input signal, and
   allowing the output circuit to output the output signal under control of the level of the first node.

9. The method of driving the shift register unit according to claim 8, wherein the shift register unit further comprises a second reset control circuit, and the method further comprises:
   allowing the second reset control circuit to control the level of the reset control node in response to a reset signal so that the first node reset circuit resets the first node under control of the level of the reset control node.

10. A gate driving circuit, comprising a plurality of cascaded shift register units each comprising an input circuit, a first node reset circuit, an output circuit and a first reset control circuit,
    wherein the input circuit is connected to a first node and is configured to provide an input signal to the first node,
    the first node reset circuit is connected with the first node and a reset control node, and is configured to reset the first node under control of a level of the reset control node,
    the output circuit is connected with the first node and an output terminal, and is configured to output an output signal at the output terminal under control of a level of the first node, and
    the first reset control circuit is connected to the reset control node and is configured to control the level of the reset control node in response to a reset control signal;
    wherein the first reset control circuit comprises a first control sub-circuit;
    the first control sub-circuit is connected to the reset control node and is configured to control the level of the reset control node in response to a clock signal, and the reset control signal comprises the clock signal; and
    the output circuit outputs the clock signal as the output signal at the output terminal under control of the level of the first node;
    wherein the first control sub-circuit comprises an inverting circuit that is configured to apply an inverting signal that is inverted from the clock signal to the reset control node for controlling the level of the reset control node;
    wherein the inverting circuit comprises a first transistor and a second transistor;
    a gate electrode of the first transistor and a first electrode of the first transistor are electrically connected, and are configured to be respectively connected to a first voltage terminal to receive a first voltage, and a second electrode of the first transistor is connected to the reset control node; and
    a gate electrode of the second transistor is connected to a clock signal terminal to receive the clock signal, a first electrode of the second transistor is connected to the reset control node, and a second electrode of the second transistor is connected to a second voltage terminal to receive a second voltage;
    the first voltage terminal is configured to provide a DC high-level signal, and the first voltage comprises the DC high-level signal.

11. The gate driving circuit according to claim 10, further comprising clock signal lines,
    wherein the clock signal lines are connected with clock signal terminals of the plurality of cascaded shift register units to provide clock signals, and
    the reset control signal comprises the clock signal.

12. A display device, comprising the gate driving circuit, wherein the gate driving circuit comprises a plurality of cascaded shift register units each comprising an input circuit, a first node reset circuit, an output circuit and a first reset control circuit,
    wherein the input circuit is connected to a first node and is configured to provide an input signal to the first node,
    the first node reset circuit is connected with the first node and a reset control node, and is configured to reset the first node under control of a level of the reset control node,
    the output circuit is connected with the first node and an output terminal, and is configured to output an output signal at the output terminal under control of a level of the first node, and
    the first reset control circuit is connected to the reset control node and is configured to control the level of the reset control node in response to a reset control signal;
    wherein the first reset control circuit comprises a first control sub-circuit;
    the first control sub-circuit is connected to the reset control node and is configured to control the level of the reset control node in response to a clock signal, and the reset control signal comprises the clock signal; and
    the output circuit outputs the clock signal as the output signal at the output terminal under control of the level of the first node;
    wherein the first control sub-circuit comprises an inverting circuit that is configured to apply an inverting signal that is inverted from the clock signal to the reset control node for controlling the level of the reset control node;
    wherein the inverting circuit comprises a first transistor and a second transistor;
    a gate electrode of the first transistor and a first electrode of the first transistor are electrically connected, and are configured to be respectively connected to a first voltage terminal to receive a first voltage, and a second electrode of the first transistor is connected to the reset control node; and a gate electrode of the second transistor is connected to a clock signal terminal to receive the clock signal, a first electrode of the second transistor is connected to the reset control node, and a second electrode of the second transistor is connected to a second voltage terminal to receive a second voltage;

the first voltage terminal is configured to provide a DC high-level signal, and the first voltage comprises the DC high-level signal.

\* \* \* \* \*